United States Patent
Fukushima et al.

(10) Patent No.: US 10,958,240 B2
(45) Date of Patent: Mar. 23, 2021

(54) ELASTIC WAVE DEVICE

(71) Applicant: Murata Manufacturing Co., Ltd., Nagaokakyo (JP)

(72) Inventors: Masahiro Fukushima, Nagaokakyo (JP); Seiji Kai, Nagaokakyo (JP); Takuya Koyanagi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 614 days.

(21) Appl. No.: 15/831,467

(22) Filed: Dec. 5, 2017

(65) Prior Publication Data
US 2018/0102757 A1    Apr. 12, 2018

Related U.S. Application Data

(63) Continuation of application No. PCT/JP2016/067407, filed on Jun. 10, 2016.

(30) Foreign Application Priority Data

Jun. 25, 2015   (JP) .............................. JP2015-127147

(51) Int. Cl.
*H03H 9/02*    (2006.01)
*H03H 9/10*    (2006.01)
*H03H 9/205*   (2006.01)

(52) U.S. Cl.
CPC ...... *H03H 9/1071* (2013.01); *H03H 9/02574* (2013.01); *H03H 9/02897* (2013.01);
(Continued)

(58) Field of Classification Search
CPC ............. H03H 9/1071; H03H 9/02574; H03H 9/02897; H03H 9/02984; H03H 9/02992
(Continued)

(56) References Cited

U.S. PATENT DOCUMENTS

| 2002/0101304 A1 | 8/2002 | Onishi et al. |
| 2010/0038992 A1* | 2/2010 | Moriya .............. H03H 9/02574 310/313 B |

(Continued)

FOREIGN PATENT DOCUMENTS

| JP | 2002-261582 A | 9/2002 |
| JP | 2004-274574 A | 9/2004 |

(Continued)

OTHER PUBLICATIONS

Official Communication issued in International Patent Application No. PCT/JP2016/067407, dated Aug. 16, 2016.
(Continued)

*Primary Examiner* — Derek J Rosenau
(74) *Attorney, Agent, or Firm* — Keating & Bennett, LLP (57) ABSTRACT

An elastic wave device includes a multilayer film stacked on a support substrate. A first support layer surrounds a region including interdigital transducer electrodes. A second support layer is disposed in the region surrounded by the first support layer. A cover is fixed on the first support layer and the second support layer so as to close a cavity defined by the first support layer. The multilayer film is partially disposed on the support substrate, and an insulating layer is disposed in at least a portion of a region in which the multilayer film is not disposed. At least one of the first support layer and the second support layer is disposed on the insulating layer.

14 Claims, 6 Drawing Sheets

(52) U.S. Cl.
CPC .... *H03H 9/02984* (2013.01); *H03H 9/02992* (2013.01); *H03H 9/205* (2013.01)

(58) Field of Classification Search
USPC ...... 310/313 R, 313 A, 313 B, 313 C, 313 D
See application file for complete search history.

(56) References Cited

U.S. PATENT DOCUMENTS

| | | | | |
|---|---|---|---|---|
| 2011/0115339 | A1* | 5/2011 | Makibuchi | ............... H01L 23/10 |
| | | | | 310/340 |
| 2013/0285768 | A1 | 10/2013 | Watanabe et al. | |
| 2014/0125197 | A1* | 5/2014 | Fujita | .................. H01L 41/0477 |
| | | | | 310/313 B |
| 2014/0152146 | A1 | 6/2014 | Kimura et al. | |
| 2014/0354114 | A1 | 12/2014 | Moriya et al. | |
| 2016/0261249 | A1 | 9/2016 | Takamine | |
| 2016/0380611 | A1* | 12/2016 | Kai | .................... H03H 9/02992 |
| | | | | 310/313 B |

FOREIGN PATENT DOCUMENTS

| | | | |
|---|---|---|---|
| JP | 2006-121356 | A | 5/2006 |
| JP | 2007-036656 | A | 2/2007 |
| JP | 2008-060382 | A | 3/2008 |
| JP | 2010-278972 | A | 12/2010 |
| JP | 2014-236387 | A | 12/2014 |
| WO | 2012/086441 | A1 | 6/2012 |
| WO | 2012/086639 | A1 | 6/2012 |
| WO | 2015/080045 | A1 | 6/2015 |

OTHER PUBLICATIONS

Official Communication issued in Japanese Patent Application No. 2017-525206, dated Dec. 18, 2018.

* cited by examiner

ELASTIC WAVE DEVICE

CROSS REFERENCE TO RELATED APPLICATIONS

This application claims the benefit of priority to Japanese Patent Application No. 2015-127147 filed on Jun. 25, 2015 and is a Continuation Application of PCT Application No. PCT/JP2016/067407 filed on Jun. 10, 2016. The entire contents of each application are hereby incorporated herein by reference.

BACKGROUND OF THE INVENTION

1. Field of the Invention

The present invention relates to an elastic wave device in which a multilayer film including a piezoelectric thin film is stacked on a support substrate.

2. Description of the Related Art

In an elastic wave device according to International Publication WO2012/086639A1, a multilayer film is disposed on a support substrate, and a piezoelectric thin film is stacked on the multilayer film. The multilayer film includes a high acoustic velocity film and a low acoustic velocity film. The low acoustic velocity film is made of a film through which a bulk wave propagates at an acoustic velocity lower than the acoustic velocity of a bulk wave that propagates through the piezoelectric thin film. The high acoustic velocity film is made of a film through which a bulk wave propagates at an acoustic velocity higher than the acoustic velocity of an elastic wave that propagates through the piezoelectric thin film. The low acoustic velocity film is stacked on the high acoustic velocity film. An interdigital transducer electrode is disposed on the piezoelectric thin film.

In the elastic wave device described in International Publication WO2012/086639A1, the piezoelectric thin film is made of a piezoelectric single crystal, e.g., LiTaO$_3$. Consequently, cracking and chipping easily occur due to an external force. Also, when the elastic wave device is bonded to an external connection terminal, e.g., a bump, stress is applied to a multilayer body including the piezoelectric thin film and the multilayer film. As a result, cracking and chipping of the piezoelectric thin film may also occur in a bonding step.

In addition, a mother structure is typically divided into an elastic wave device by dicing. Cracking and chipping of the piezoelectric thin film may also occur due to forces during dicing. Further, interfacial peeling may occur in the multilayer body including the piezoelectric thin film during connection of the external connection terminal and dicing.

In addition, regarding the elastic wave device described in International Publication WO2012/086639A1, when a support layer and a cover are disposed such that the interdigital transducer electrode faces a hollow portion and pressure is applied to the cover, the elastic wave device may be damaged because of the hollow portion being crushed.

SUMMARY OF THE INVENTION

Preferred embodiments of the present invention provide high-strength elastic wave devices in which cracking and chipping of a piezoelectric thin film do not easily occur and interfacial peeling does not easily occur in a multilayer film.

An elastic wave device according to a preferred embodiment of the present invention includes a support substrate, a multilayer film which includes a piezoelectric thin film and at least one layer other than the piezoelectric thin film and in which the layer other than the piezoelectric thin film is located on the support substrate, an interdigital transducer electrode disposed on one surface of the piezoelectric thin film, a first support layer disposed so as to surround a region in which the interdigital transducer electrode is disposed, a second support layer disposed in the region surrounded by the first support layer, and a cover fixed on the first and second support layers so as to close a cavity defined by the first support layer, wherein the multilayer film is partially disposed on the support substrate, an insulating layer is disposed in at least a portion of a region in which the multilayer film is not disposed, and at least one of the first support layer and the second support layer is disposed on the insulating layer.

In an elastic wave device according to a preferred embodiment of the present invention, the insulating layer extends from a location on the piezoelectric thin film through the side surface of the piezoelectric thin film and the side surface of the multilayer film to at least a portion of the region in which the multilayer film is not disposed. With this configuration, interfacial peeling does not easily occur in the multilayer film.

In an elastic wave device according to a preferred embodiment of the present invention, a first wiring electrode which is electrically connected to the interdigital transducer electrode and which extends from a location on the piezoelectric thin film to a location on the insulating layer is further included, wherein at least a portion of the first support layer is disposed on the first wiring electrode. With this configuration, when an external connection terminal is disposed, cracking and chipping of a piezoelectric thin film do not easily occur even if a force is applied to the first support layer.

In an elastic wave device according to a preferred embodiment of the present invention, in a portion in which the insulating layer is located on the piezoelectric thin film, the surface opposite to the piezoelectric thin film of the insulating layer includes an inclined surface inclining so as to approach the cover with increasing proximity to the first support layer from the interdigital transducer electrode.

In an elastic wave device according to a preferred embodiment of the present invention, the first wiring electrode includes a portion that is located on the inclined surface of the insulating layer and the portion is inclined along the inclined surface of the insulating layer. With this configuration, breakage does not easily occur in the first wiring electrode.

In an elastic wave device according to a preferred embodiment of the present invention, the first support layer and the insulating layer are made of the same material.

In an elastic wave device according to a preferred embodiment of the present invention, a second wiring electrode which is electrically connected to the interdigital transducer electrode and which extends from a location on the piezoelectric thin film to a location on the insulating layer is further included, wherein at least a portion of the second support layer is disposed on the second wiring electrode. With this configuration, three-dimensional wiring of the wire disposed on the piezoelectric thin film and the second wiring electrode are able to be constructed, and the productivity is improved.

In an elastic wave device according to a preferred embodiment of the present invention, the height direction is the direction in which the support substrate and the cover face each other, and the level of the location in the height direction of the surface of the first support layer, which faces the cover, and the level of the location in the height direction of the surface of the second support layer, which faces the cover, are the same or substantially the same. With this configuration, the sealing performance of the hollow portion is improved.

In an elastic wave device according to a preferred embodiment of the present invention, the first support layer is disposed on the insulating layer, and the thickness of the insulating layer is set such that the level of the location in the height direction of the surface of the first support layer, which faces the cover, and the level of the location in the height direction of the surface of the second support layer, which faces the cover, are the same or substantially the same. With this configuration, the sealing performance of the hollow portion is further improved.

In an elastic wave device according to a preferred embodiment of the present invention, the second support layer is disposed on the insulating layer, and the thickness of the insulating layer is set such that the level of the location in the height direction of the surface of the first support layer, which faces the cover, and the level of the location in the height direction of the surface of the second support layer, which faces the cover, are the same or substantially the same. With this configuration, the sealing performance of the hollow portion is further improved.

In an elastic wave device according to a preferred embodiment of the present invention, the multilayer film includes a high acoustic velocity film through which a bulk wave propagates at an acoustic velocity higher than the acoustic velocity of an elastic wave that propagates through the piezoelectric thin film, as the layer other than the piezoelectric thin film, and the piezoelectric thin film is stacked on the high acoustic velocity film. With this configuration, the Q value is increased.

In an elastic wave device according to a preferred embodiment of the present invention, the multilayer film includes a high acoustic velocity film through which a bulk wave propagates at an acoustic velocity higher than the acoustic velocity of an elastic wave that propagates through the piezoelectric thin film, and a low acoustic velocity film, which is stacked on the high acoustic velocity film and through which a bulk wave propagates at an acoustic velocity lower than the acoustic velocity of an elastic wave that propagates through the piezoelectric thin film, as layers other than the piezoelectric thin film, and the piezoelectric thin film is stacked on the low acoustic velocity film. With this configuration, the Q value is further increased.

In an elastic wave device according to a preferred embodiment of the present invention, the support substrate is a high acoustic velocity substrate through which a bulk wave propagates at an acoustic velocity higher than the acoustic velocity of an elastic wave that propagates through the piezoelectric thin film, the multilayer film includes a low acoustic velocity film through which a bulk wave propagates at an acoustic velocity lower than the acoustic velocity of an elastic wave that propagates through the piezoelectric thin film, as the layer other than the piezoelectric thin film, and the piezoelectric thin film is stacked on the low acoustic velocity film. With this configuration, the Q value is further increased.

In an elastic wave device according to a preferred embodiment of the present invention, the multilayer film includes a high acoustic impedance film having relatively high acoustic impedance and a low acoustic impedance film having acoustic impedance lower than the acoustic impedance of the high acoustic impedance film as layers other than the piezoelectric thin film. With this configuration, the Q value is increased.

In the elastic wave devices according to various preferred embodiments of the present invention, cracking and chipping of the piezoelectric thin film is reduced or prevented, and interfacial peeling in the multilayer film and between the multilayer film and the piezoelectric thin film does not easily occur. In addition, the strength of the elastic wave devices is able to be improved.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a sectional view of an elastic wave device according to a first preferred embodiment of the present invention, along line I-I in FIG. 2.

FIG. 2 is a schematic plan view of the elastic wave device according to the first preferred embodiment of the present invention, although a cover is not shown in the drawing.

FIG. 3 is a sectional view of an elastic wave device according to a comparative example, which corresponds to a section along line I-I in FIG. 2, although a cover is not shown in the drawing.

FIG. 4 is a sectional view of an elastic wave device according to a second preferred embodiment of the present invention, which corresponds to the section along line I-I in FIG. 2.

FIG. 5 is a sectional view of an elastic wave device according to a third preferred embodiment of the present invention, which corresponds to the section along line I-I in FIG. 2.

FIG. 6A is a magnified partial cutaway sectional view illustrating a key portion of the elastic wave device according to the third preferred embodiment of the present invention, and FIG. 6B is a further magnified partial cutaway sectional view illustrating a key portion of the diagram shown in FIG. 6A.

FIG. 7 is a sectional view of an elastic wave device according to a fourth preferred embodiment of the present invention, which corresponds to the section along line I-I in FIG. 2.

FIG. 8 is a sectional view of an elastic wave device according to a fifth preferred embodiment of the present invention, which corresponds to the section along line I-I in FIG. 2.

FIG. 9 is a sectional front view of a multilayer film according to a sixth preferred embodiment of the present invention.

DETAILED DESCRIPTION OF THE PREFERRED EMBODIMENTS

The specific preferred embodiments of the present invention will be described below with reference to the drawings so as to clarify the present invention.

In this regard, it is indicated that each of the preferred embodiments described in the present specification is an exemplification and that the configuration may be partially replaced or combined with the configuration of another preferred embodiment.

Figure 1:
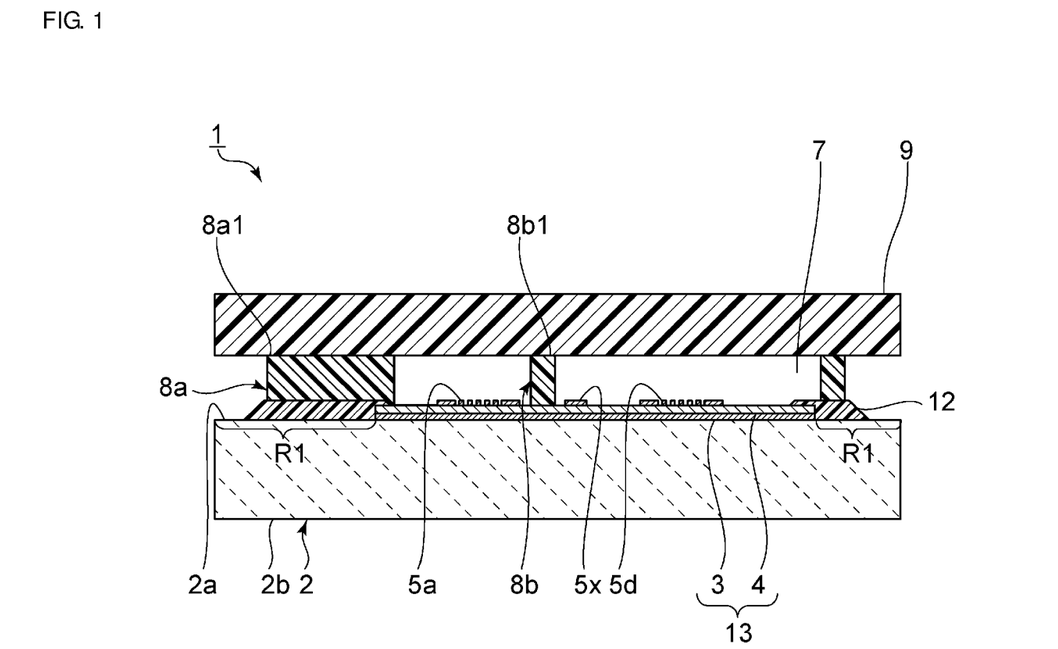

FIG. 1 is a sectional view of an elastic wave device according to a first preferred embodiment of the present invention, along line I-I in FIG. 2 described later.

An elastic wave device 1 includes a support substrate 2. The support substrate 2 includes a first principal surface 2a and a second principal surface 2b which are opposite to each other. A multilayer film 13 is disposed on the first principal surface 2a. More specifically, the multilayer film 13 includes a piezoelectric thin film 4 and a low acoustic velocity film 3 as a layer other than the piezoelectric thin film 4. The low acoustic velocity film 3 is stacked on the first principal surface 2a, and the piezoelectric thin film 4 is stacked on the low acoustic velocity film 3. The low acoustic velocity film 3 is a film through which a bulk wave propagates at an acoustic velocity lower than the acoustic velocity of an elastic wave that propagates through the piezoelectric thin film 4.

In the present preferred embodiment, the support substrate 2 is a high acoustic velocity substrate. The high acoustic velocity substrate is a substrate through which a bulk wave propagates at an acoustic velocity higher than the acoustic velocity of an elastic wave that propagates through the piezoelectric thin film 4. A material used for the high acoustic velocity substrate may be any piezoelectric material, e.g., aluminum nitride, aluminum oxide, silicon carbide, silicon nitride, silicon, sapphire, lithium tantalate, lithium niobate, and quartz, various ceramics, e.g., alumina, zirconia, cordierite, mullite, steatite, and forsterite, magnesia, diamond, materials in which the above-described materials are primary components, and materials in which mixtures of the above-described materials are primary components.

In this regard, the acoustic velocity of a bulk wave is intrinsic to a substrate, and there is a P wave that oscillates in the travelling direction of the wave, i.e., the longitudinal direction, and an S wave that oscillates in the direction perpendicular or substantially perpendicular to the travelling direction, i.e., the transverse direction. The above-described bulk wave propagates through any of the piezoelectric thin film 4, the high acoustic velocity substrate, and the low acoustic velocity film 3. Regarding an isotropic material, there is a P wave and an S wave. Regarding an anisotropic material, there is a P wave, a slow S wave, and a fast S wave. Then, when a surface acoustic wave is excited by using the anisotropic material, two S waves, an SH (shear horizontal) wave, and an SV (shear vertical) wave, are generated. In the present specification, the acoustic velocity of an elastic wave in the main mode, which propagates through the piezoelectric thin film 4, relates to a mode, among three modes of a P wave mode, an SH (shear horizontal) wave mode, and an SV (shear vertical) wave mode, used to determine a pass band for a filter and resonance characteristics for a resonator.

In the present preferred embodiment, the piezoelectric thin film 4 is preferably made of LiTaO$_3$, for example. In this regard, the material used for the piezoelectric thin film may be any one of LiTaO$_3$, LiNbO$_3$, ZnO, AlN, and PZT, for example. Meanwhile, when the wavelength of the elastic wave that is determined in accordance with the electrode period of the interdigital transducer electrode, described later, is assumed to be λ, the thickness of the piezoelectric thin film 4 is preferably about 1.5λ or less, for example. This is because in such a situation, the electromechanical coupling coefficient is able to be easily adjusted by selecting the film thickness of the piezoelectric thin film 4 within the range of about 1.5λ or less, for example.

The support substrate 2 is made of an appropriate material, e.g., silicon, that satisfies the above-described acoustic velocity relationship. The low acoustic velocity film 3 is made of an appropriate material through which a bulk wave propagates at an acoustic velocity lower than the acoustic velocity of an elastic wave that propagates through the piezoelectric thin film 4. Examples of such a material include silicon oxide, glass, silicon oxynitride, tantalum oxide, and a compound produced by adding fluorine, carbon, or boron to silicon oxide. The low acoustic velocity film 3 may include a mixed material in which these materials are primary components.

In this regard, a close contact layer may preferably be disposed between the support substrate 2 structured to function as the high acoustic velocity substrate and the piezoelectric thin film 4. The close contact property between the support substrate 2 and the piezoelectric thin film 4 may be improved by providing the close contact layer. The close contact layer may be a resin or a metal and, for example, an epoxy resin or a polyimide resin may preferably be used.

The support substrate 2 structured to function as the high acoustic velocity substrate and the low acoustic velocity film 3 are stacked on the piezoelectric thin film 4 and, thus, the Q value is able to be increased, as described in International Publication WO2012/086639A1.

Meanwhile, the multilayer film may preferably include a high acoustic velocity film through which a bulk wave propagates at an acoustic velocity higher than the acoustic velocity of an elastic wave that propagates through the piezoelectric thin film. With this configuration, it is not necessary that the support substrate be a high acoustic velocity substrate. It is preferable that the high acoustic velocity film be stacked on the first principal surface of the support substrate, the low acoustic velocity film be stacked on the high acoustic velocity film, and the piezoelectric thin film be stacked on the low acoustic velocity film. Examples of the material used for the high acoustic velocity film include a piezoelectric material, e.g., aluminum nitride, aluminum oxide, silicon carbide, silicon nitride, silicon oxynitride, a DLC film, silicon, sapphire, lithium tantalate, lithium niobate, and quartz, various ceramics, e.g., alumina, zirconia, cordierite, mullite, steatite, and forsterite, magnesia, and diamond. In addition, materials in which the above-described materials are primary components and materials in which mixtures of the above-described materials are primary components may be used. Also, with this configuration, the Q value is able to be increased.

Figure 2:
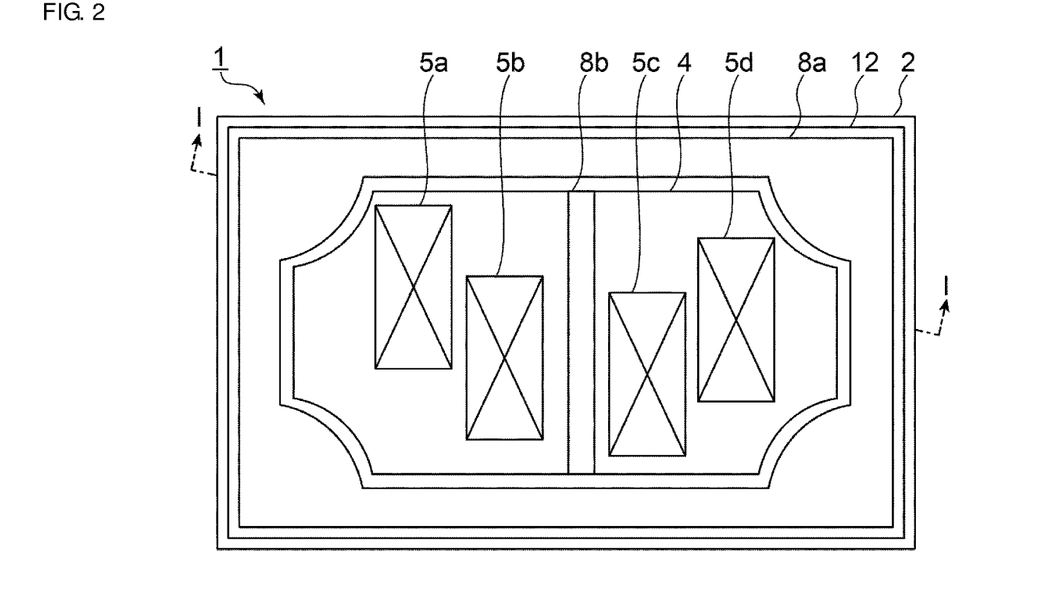

FIG. 2 is a schematic plan view of the elastic wave device 1. Here, an electrode structure under a cover, described later, is schematically shown through the cover.

Interdigital transducer electrodes 5a to 5d are disposed on the piezoelectric thin film 4. Although not shown in FIG. 2, in addition to the interdigital transducer electrodes 5a to 5d, a wire 5x and other structural elements shown in FIG. 1 are also disposed on the piezoelectric thin film 4. The interdigital transducer electrodes 5a to 5d are electrically connected to each other by such wires. In this regard, in FIG. 2, the regions in which the interdigital transducer electrodes 5a to 5d are disposed are schematically indicated by rectangles with diagonals.

In the present preferred embodiment, a plurality of surface acoustic wave resonators including the interdigital transducer electrodes 5a to 5d are connected to each other. Consequently, a band pass filter is constructed. In this regard, there is no particular limitation regarding the filter circuit.

A hollow portion 7 shown in FIG. 1 is located so as not to constrain elastic waves excited by the interdigital transducer electrodes 5a to 5d. That is, a first support layer 8a including a cavity is disposed on the support substrate 2. A second support layer 8b is disposed in the region surrounded by the first support layer 8a. The first support layer 8a and the second support layer 8b are made of an appropriate synthetic resin. The first support layer 8a and the second support layer 8b may preferably be made of an inorganic insulating material. In this regard, a plurality of second support layers may be disposed.

As also shown in FIG. 1, a cover 9 is disposed so as to close the cavity of the first support layer 8a. The hollow portion 7 is sealed by the cover 9 and the first support layer 8a.

The height direction of the elastic wave device 1 is the direction in which the support substrate 2 and the cover 9 face each other. The first support layer 8a includes a surface 8a1 that faces the cover 9 in the height direction. The second support layer 8b also includes a surface 8b1 that faces the cover 9 in the height direction.

In the support substrate 2, the multilayer film 13 is partially disposed. That is, regarding the first principal surface 2a of the support substrate 2, a region R1 in which the multilayer film 13 is not present is disposed outside the region in which the multilayer film 13 is present.

An insulating layer 12 is disposed in the region R1 on the support substrate 2. In the present preferred embodiment, the first support layer 8a is disposed directly on the insulating layer 12. The insulating layer 12 is made of a synthetic resin. Examples of the synthetic resin include polyimide and epoxy. In this regard, the insulating layer 12 may be made of an inorganic insulating material, and there is no particular limitation regarding the material of the insulating layer 12. For example, appropriate materials, e.g., SOG, $SiO_2$, TEOS, and SiN, may preferably be used as the materials for the insulating layer 12. The insulating layer 12 may be either a single layer or a multilayer body.

The insulating layer 12 is disposed in the region R1 and, therefore, an external connection terminal, e.g., a bump, may be bonded in the region R1. In addition, when division by dicing is performed, dicing may be performed in the region R1. Consequently, a force is not easily applied to the piezoelectric thin film during a bonding step and dicing, and cracking and chipping of the piezoelectric thin film do not easily occur. In addition, interfacial peeling does not easily occur in the multilayer film 13 including the piezoelectric thin film.

Another feature of the present preferred embodiment is that the first support layer 8a and the second support layer 8b are included and the first support layer 8a is disposed on the insulating layer 12 disposed in the region R1 on the support substrate 2. Consequently, the cover is not easily damaged when pressure is applied to the cover, and the strength is improved.

Further, the distance between the surface 8a1 of the first support layer 8a and the surface 8b1 of the second support layer 8b in the height direction, that is, the difference in the height, is able to be decreased. As a result, the hollow portion 7 is able to be reliably sealed by the cover 9, and the sealing performance is improved. Therefore, reliability is improved. This will be described below with reference to a comparative example.

Figure 3:
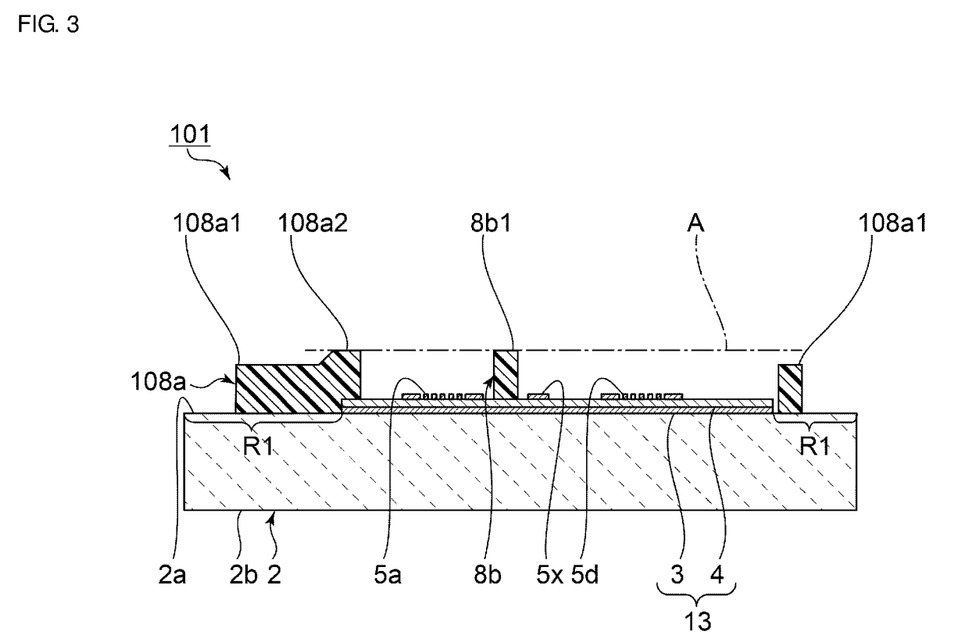

FIG. 3 is a sectional view of an elastic wave device according to the comparative example, which corresponds to a section along line I-I in FIG. 2, although a cover is not shown in the drawing.

The elastic wave device 101 according to the comparative example has the same or similar configuration as the configuration of the elastic wave device 1 according to the first preferred embodiment except that the insulating layer 12 is not included.

The first support layer 108a of the elastic wave device 101 includes a portion located in the region R1 of the support substrate 2 and a portion located on the piezoelectric thin film 4. The first support layer 108a includes a surface 108a1 which faces the cover and which overlaps the region R1 in plan view when viewed from the cover side. Further, the first support layer 108a includes a surface 108a2 which faces the cover and which overlaps the piezoelectric thin film 4 in plan view described above. As indicated by alternate long and short dashed lines A, the locations in the height direction of the surface 108a1 and the surface 108a2 are at different levels. The location in the height direction of the surface 108a1 is at a level different from the level of the location in the height direction of the surface 8b1 of the second support layer 8b.

Consequently, there is a difference in the height between the portion at which the first support layer 108a is bonded to the cover and the portion at which the second support layer 8b is bonded to the cover. Therefore, the sealing performance of the hollow portion may be insufficiently improved by the cover, the first support layer 108a, and the second support layer 8b. For example, the surface 8b1 of the second support layer 8b, which protrudes toward the cover, may stick into the cover. As a result, a failure due to leakage may occur.

Meanwhile, in the present preferred embodiment shown in FIG. 1, the first support layer 8a is disposed on the insulating layer 12 in the region R1. The thickness of the insulating layer 12 is the same or substantially the same as the thickness of the multilayer film 13 made of the low acoustic velocity film 3 and the piezoelectric thin film 4. Consequently, there is almost no difference in the height on the surface 8a1 of the first support layer 8a. The location in the height direction of the surface 8a1 of the first support layer 8a and the location in the height direction of the surface 8b1 of the second support layer 8b are at the same or substantially the same level.

Therefore, the sealing performance of the hollow portion 7 is improved by the cover 9, the first support layer 8a, and the second support layer 8b. There is no portion that protrudes toward the cover 9 to a significant extent and, as a result, a failure due to leakage, which may occur in the comparative example, is unlikely to occur. Consequently, reliability is effectively improved.

In addition, the hollow portion 7 is not easily crushed because the cover 9 is supported by the first support layer 8a and the second support layer 8b. Therefore, the strength of the elastic wave device 1 is improved, as described above.

It is preferable that the first support layer 8a and the insulating layer 12 be made of the same material. The close contact property between the first support layer 8a and the insulating layer 12 is improved as a result thereof. Consequently, the sealing performance of the hollow portion is further improved.

Next, a non-limiting example of a method for manufacturing the elastic wave device according to the present preferred embodiment will be described.

The support substrate 2 structured to function as a high acoustic velocity substrate is prepared. Thereafter, the low acoustic velocity film 3 is stacked on the support substrate 2 by, for example, a sputtering method or a CVD method. Subsequently, the piezoelectric thin film 4 is stacked on the low acoustic velocity film 3 by, for example, a sputtering method or a CVD method. Then, the interdigital transducer electrodes 5a to 5d shown in FIG. 2 are disposed on the piezoelectric thin film 4 by, for example, an evaporation•lift-off method. The wire 5x is disposed at the same time.

Thereafter, patterning of a resist is performed by photolithography, for example. Subsequently, the resist is used as a mask and the low acoustic velocity film 3 and the piezoelectric thin film 4 are removed by using, for example, an ICP-RIP (inductive coupled plasma-reactive ion etching) apparatus. In this manner, the region R1 is formed on the support substrate 2.

Subsequently, the insulating layer 12 is formed in the region R1 on the support substrate 2 by, for example, photolithography. As described above, the insulating layer 12 may be a single layer or be a multilayer body.

Then, the first support layer 8a and the second support layer 8b are disposed by, for example, photolithography. Thereafter, the cover 9 is disposed on the first support layer 8a and the second support layer 8b.

Figure 4:
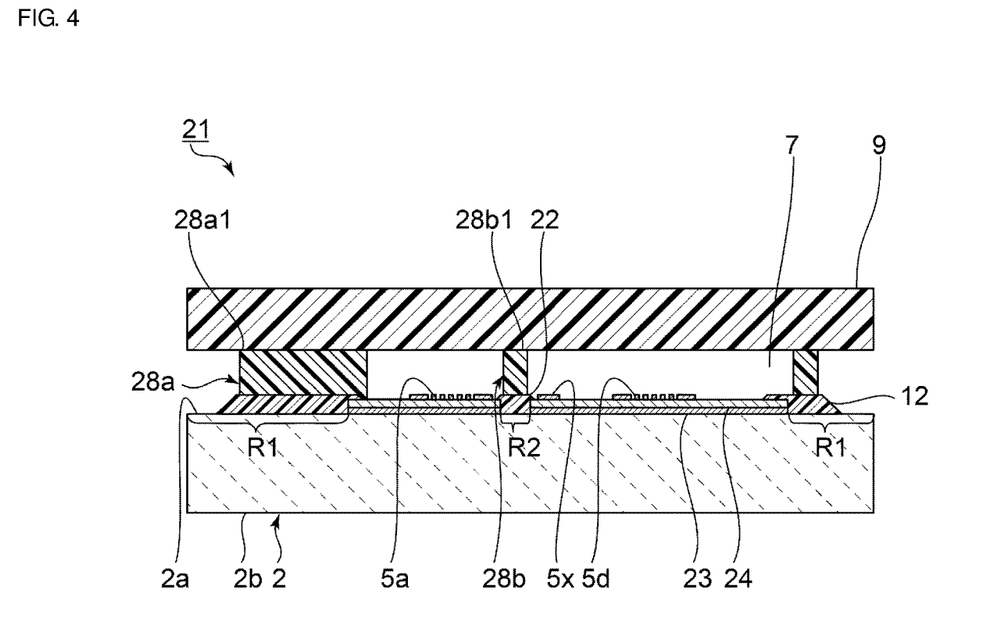

FIG. 4 is a sectional view of an elastic wave device according to a second preferred embodiment of the present invention, which corresponds to the section along line I-I in FIG. 2.

An elastic wave device 21 is different from the first preferred embodiment in that the location at which the multilayer film made of a low acoustic velocity film 23 and a piezoelectric thin film 24 are not present and in that an insulating layer 22 is provided. The elastic wave device 21 has the same or substantially the same configuration as the configuration of the elastic wave device 1 according to the first preferred embodiment except for the above-described aspects.

More specifically, there is a region R2, in which the multilayer film made of the low acoustic velocity film 23 and the piezoelectric thin film 24 are not present, in a portion surrounded by a first support layer 28a.

The insulating layer 22 is disposed in the region R2 on the support substrate 2. A second support layer 28b is disposed on the insulating layer 22. The first support layer 28a is disposed on the insulating layer 12 disposed in the region R1. The thickness of the insulating layer 12 and the thickness of the insulating layer 22 are preferably the same or substantially the same as the thickness of the above-described multilayer film.

In the present preferred embodiment, in the same or similar manner as in the first preferred embodiment, the level of the location in the height direction of the surface 28a1 of the first support layer 28a and the level of the location in the height direction of the surface 28b1 of the second support layer 28b are the same or substantially the same. Therefore, the sealing performance of the hollow portion 7 is high, and the strength of the elastic wave device 21 is high.

In this regard, as shown in the first preferred embodiment and the second preferred embodiment, it is only essential that at least one of the first support layer and the second support layer is disposed on the insulating film in the region in which the multilayer film is not present. It is preferable that the thickness of the insulating layer be a thickness that reduces the difference in the height between the surface facing the cover of the first support layer and the surface facing the cover of the second support layer. The sealing performance of the hollow portion is improved as a result thereof, and in addition, the strength of the elastic wave device is improved.

More preferably, the thickness of the insulating layer is set such that the level of the location in the height direction of the surface 8a1 of the first support layer 8a and the level of the location in the height direction of the surface 8b1 of the second support layer 8b are the same or substantially the same, as in the first preferred embodiment shown in FIG. 1. Alternatively, the thickness of the insulating layer 22 may preferably be set such that the level of the location in the height direction of the surface 28a1 of the first support layer 28a and the level of the location in the height direction of the surface 28b1 of the second support layer 28b are the same or substantially the same, as in the second preferred embodiment shown in FIG. 4.

Figure 5:
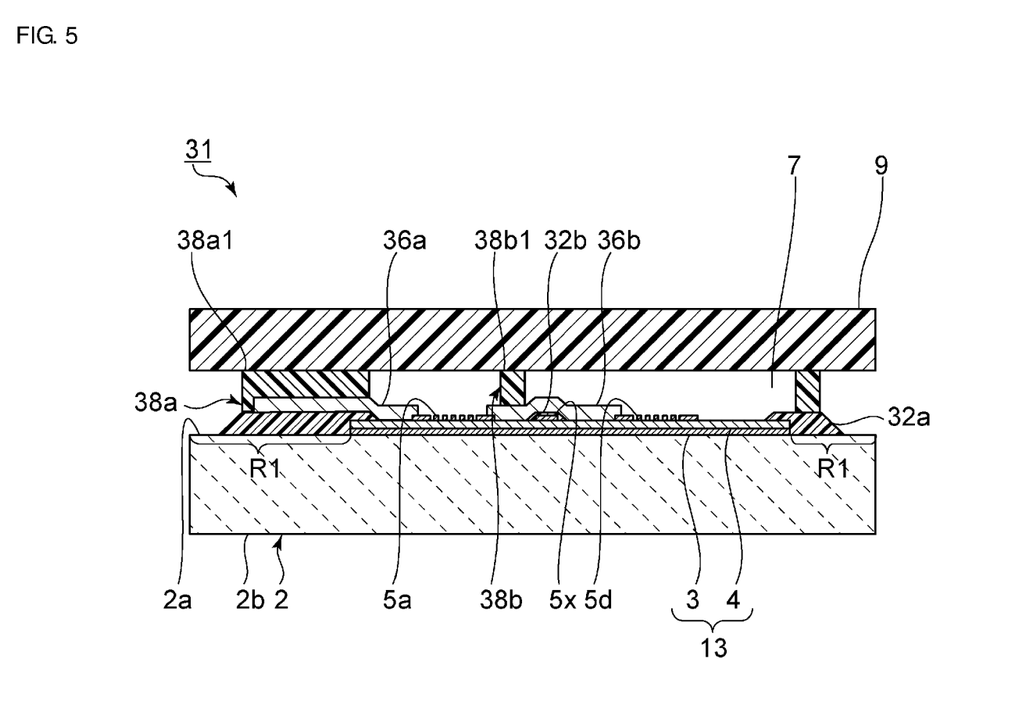

FIG. 5 is a sectional view of an elastic wave device according to a third preferred embodiment of the present invention, which corresponds to the section along line I-I in FIG. 2.

An elastic wave device 31 is different from the first preferred embodiment in that the insulating layer includes a first insulating layer 32a and a second insulating layer 32b. Also, the wiring structure of the elastic wave device 31 is different from that in the first preferred embodiment. The elastic wave device 31 has the same or substantially the same configuration as the configuration of the elastic wave device 1 according to the first preferred embodiment except for the above-described aspects.

The first insulating layer 32a of the elastic wave device 31 is disposed in the region R1 on the support substrate 2, as in the first preferred embodiment. The first insulating layer 32a extends through the side surface of the multilayer film 13 including the low acoustic velocity film 3 and the piezoelectric thin film 4 to on the piezoelectric thin film 4. The side surface of the multilayer film 13 is covered with the first insulating layer 32a, as described above, and therefore, interfacial peeling does not easily occur in the multilayer film 13.

The second insulating layer 32b is disposed on the piezoelectric thin film 4 surrounded by the first support layer 38a. The second insulating layer 32b covers at least a portion of the wire 5x. Meanwhile, a wiring electrode electrically connected to the interdigital transducer electrode 5a is also disposed on the piezoelectric thin film 4. The wiring electrode includes a first wiring electrode 36a and a second wiring electrode 36b. The second wiring electrode 36b connects the interdigital transducer electrode 5a to the interdigital transducer electrode 5d.

A portion of the second wiring electrode 36b is disposed on the second insulating layer 32b. Consequently, three-dimensional wiring of the wire 5x and the second wiring electrode 36b, which are electrically insulated from each other, is provided by the second insulating layer 32b.

At least a portion of the first support layer 38a may preferably be disposed on the first wire 36a, as in the present preferred embodiment. At least a portion of the second support layer 38b may preferably be disposed on the second wire 36b. With this configuration, the first support layer 38a is disposed above the first insulating layer 32a shown in FIG. 5. Therefore, the level of the location in the height direction of the surface 38a1 of the first support layer 38a and the level of the location in the height direction of the surface 38b1 of the second support layer 38b are preferably the same or substantially the same. Consequently, the sealing performance of the hollow portion 7 is improved, and the strength of the elastic wave device 31 is improved.

It is preferable that the first insulating layer 32a and the second insulating layer 32b be made of the same material. Consequently, a step of disposing the first insulating layer 32a and a step of disposing the second insulating layer 32b so as to provide the above-described three-dimensional wiring may be the same step. Therefore, the productivity is improved.

Meanwhile, in the present preferred embodiment, in order to make the level of the location in the height direction of the surface 38a1 of the first support layer 38a and the level of the location in the height direction of the surface 38b1 of the second support layer 38b the same or substantially the same, the thickness of the first insulating layer 32a is preferably larger than the thickness of the multilayer film 13. In this configuration, it is preferable that an inclined surface be disposed in a portion located on the piezoelectric thin film 4 of the first insulating layer 32a. The details thereof will be described with reference to FIGS. 6A and 6B.

Figure 6A:
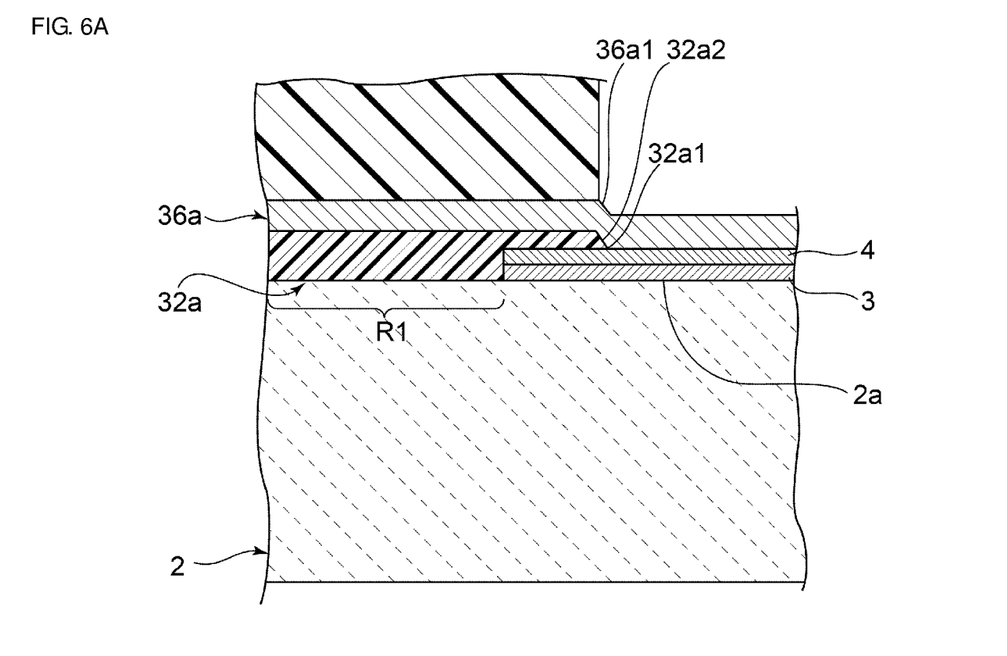
Figure 6B:
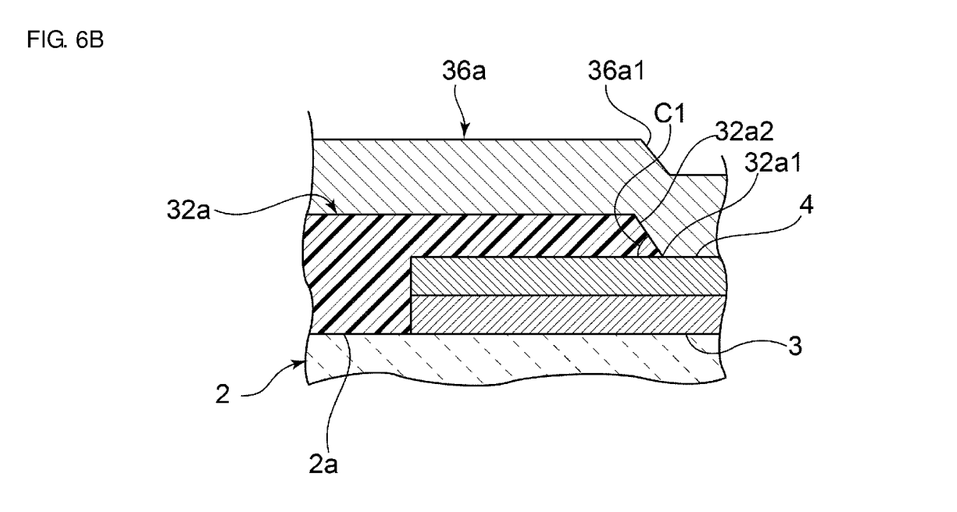

FIG. 6A is a magnified partial cutaway sectional view illustrating a portion of the elastic wave device according to the third preferred embodiment of the present invention. FIG. 6B is a further magnified partial cutaway sectional view illustrating a portion of the diagram shown in FIG. 6A.

As shown in FIG. 6A, the first insulating layer 32a extends from the portion located in the region R1 to on the piezoelectric thin film 4. An inclined surface 32a2 is disposed at an inner end 32a1 of the first insulating layer 32a. As shown in FIG. 6B, it is preferable that the angle C1 defined by the inclined surface 32a2 with the first principal surface 2a of the support substrate 2 be about 80° or less, for example. As a result, the angle that is defined by an inclined surface 36a1 of the first wiring electrode 36a disposed in accordance with the inclined surface 32a2 and the first principal surface 2a is small. Therefore, the degree of bending of the portion, in which the inclined surface 36a1 of the first wiring electrode 36a is disposed, is able to be reduced. Consequently, breakage does not easily occur in the first wiring electrode 36a.

In this regard, the angle C1 defined by the inclined surface 32a2 with the first principal surface 2a is more preferably about 60° or less, for example. Further preferably, the angle C1 defined by the inclined surface 32a2 with the first principal surface 2a is about 45° or less, for example.

As described above, the degree of bending of the first wiring electrode 36a is reduced and, thus, breakage when heat is applied and breakage in the step of forming the first wiring electrode 36a do not easily occur.

It is preferable that inclined surfaces be provided in the second insulating layer 32b and the second wiring electrode 36b, as in the first insulating layer 32a and the first wiring electrode 36a. Consequently, breakage does not easily occur in the second wiring electrode 36b.

Figure 7:
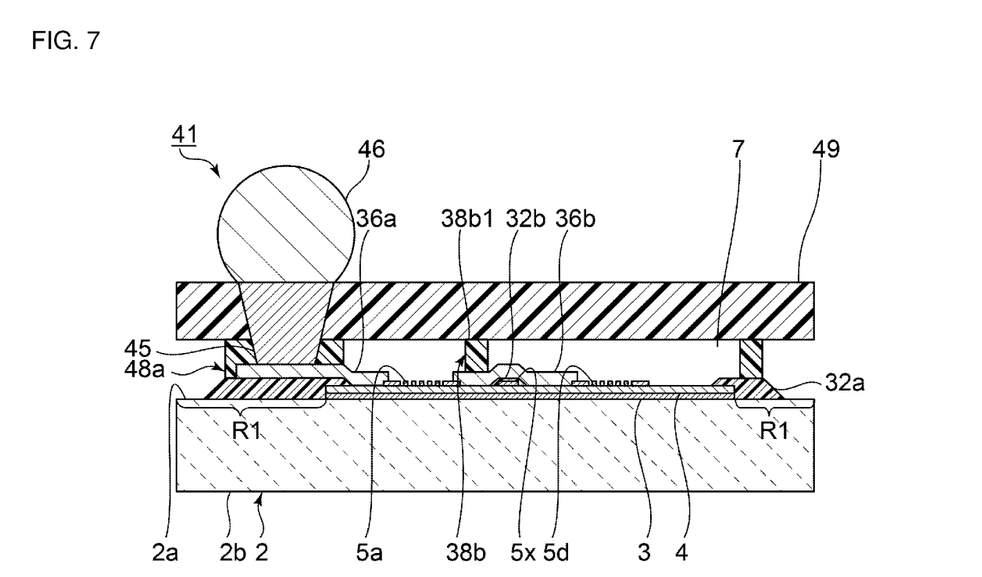

FIG. 7 is a sectional view of an elastic wave device according to a fourth preferred embodiment of the present invention, which corresponds to the section along line I-I in FIG. 2.

An elastic wave device 41 is different from the third preferred embodiment in that an under bump metal layer 45 and a metal bump 46 are included in a portion shown in FIG. 7. The elastic wave device 41 has the same or substantially the same configuration as the configuration of the elastic wave device 31 according to the third preferred embodiment except for the above-described aspects.

A through hole is located so as to pass through a first support layer 48a and a cover 49. The under bump metal layer 45 is disposed in the through hole. The metal bump 46 is bonded to the under bump metal layer 45.

The under bump metal layer 45 and the metal bump 46 are made of an appropriate metal or alloy, for example.

The lower end of the under bump metal layer 45 is bonded to the first wiring electrode 36a. Therefore, a portion that is bonded to the under bump metal layer 45 of the first wiring electrode 36a defines an electrode land portion to be connected to an external connection terminal. In the present preferred embodiment, the metal bump 46 defines the external connection terminal.

With this configuration, the sealing performance of the hollow portion 7 is improved, and the strength of the elastic wave device 41 is improved, as in the third preferred embodiment.

In the present preferred embodiment, the under bump metal layer 45 and the metal bump 46 are bonded onto the first wiring electrode 36a in the region R1. Therefore, even if a force is applied during bonding of the metal bump 46 to the under bump metal layer 45, cracking and chipping of the piezoelectric thin film 4 do not easily occur.

In this regard, when the elastic wave device 41 according to the present preferred embodiment is produced, the first wiring electrode 36a and the second wiring electrode 36b may be formed after the first insulating layer 32a and the second insulating layer 32b are provided, as in the method for manufacturing the elastic wave device 1 according to the first preferred embodiment. Subsequently, the first support layer 48a and the second support layer 38b may be provided. Further, the through hole may be formed after the cover 49 is disposed. Then, the under bump metal layer 45 is disposed by, for example, an electroplating method. Thereafter, for example, a solder bump defining the metal bump 46 is bonded to the under bump metal layer 45.

Figure 8:
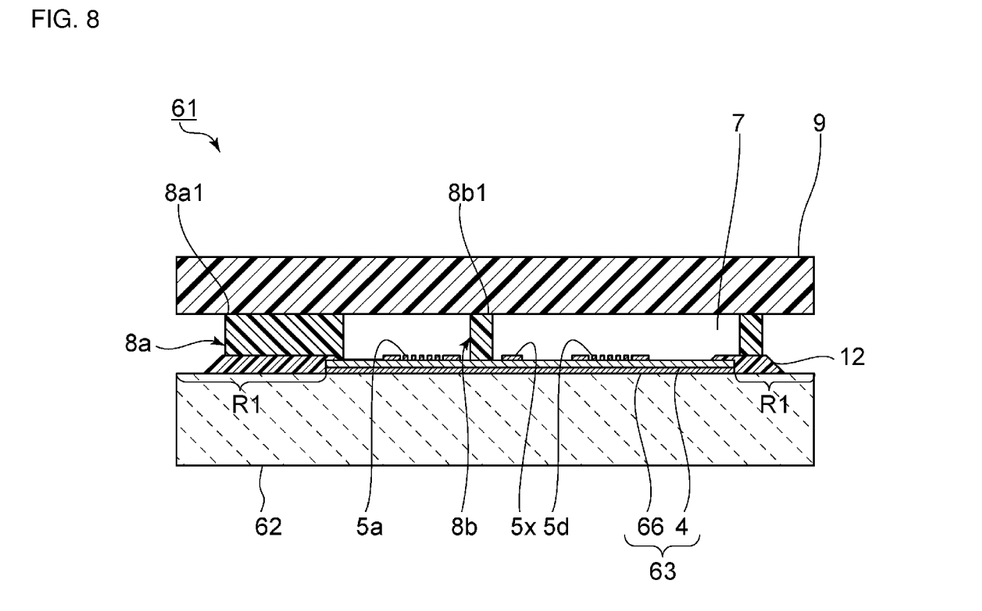

FIG. 8 is a sectional view of an elastic wave device according to a fifth preferred embodiment of the present invention, which corresponds to the section along line I-I in FIG. 2.

An elastic wave device 61 is different from the first preferred embodiment in the configurations of a support substrate 62 and a multilayer film 63. The elastic wave device 61 has the same or substantially the same configuration as the configuration of the elastic wave device 1 according to the first preferred embodiment except for the above-described aspects.

More specifically, multilayer film 63 includes a high acoustic velocity film 66 stacked on a support substrate 62. The piezoelectric thin film 4 is stacked on the high acoustic velocity film 66. The multilayer film 63 does not include a low acoustic velocity film. With this configuration, it is not necessary for the support substrate 62 to be a high acoustic velocity substrate.

Also in the present preferred embodiment, cracking and chipping of the piezoelectric thin film do not easily occur, and interfacial peeling does not easily occur in the multilayer film, in the same or similar manner as in the first preferred embodiment. Further, the strength of the elastic wave device 61 is high. The Q value is also able to be increased.

Figure 9:
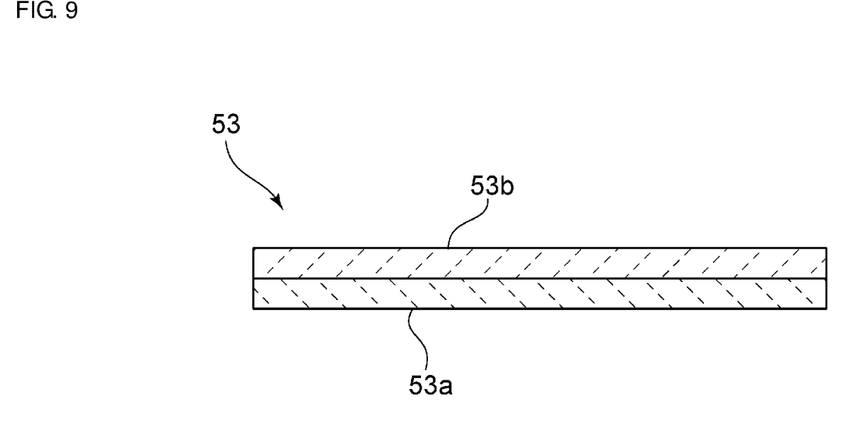

FIG. 9 is a sectional front view of a multilayer film according to a sixth preferred embodiment of the present invention. The sixth preferred embodiment has the same or substantially the same configuration as in the first preferred embodiment except for the configuration of a multilayer film 53.

In the sixth preferred embodiment, the multilayer film 53 has a structure in which a low acoustic impedance film 53b having relatively low acoustic impedance is stacked on a high acoustic impedance film 53a having relatively high acoustic impedance. With this configuration, the Q value is increased. As described above, the multilayer film may have a structure in which the high acoustic impedance film and the low acoustic impedance film are stacked. In this situation, as in the fifth preferred embodiment, it is not necessary for the support substrate to be a high acoustic velocity substrate.

Meanwhile, in various preferred embodiments of the present invention, there is no particular limitation regarding the configuration of the layer other than the piezoelectric thin film in the multilayer film.

Therefore, the multilayer film may be formed by stacking a plurality of piezoelectric thin films and dielectric films that improve the temperature characteristics, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed:

1. An elastic wave device comprising:
   a support substrate;
   a multilayer film including a piezoelectric thin film and at least one layer other than the piezoelectric thin film, and in which the at least one layer other than the piezoelectric thin film is located on the support substrate;
   an interdigital transducer electrode disposed on one surface of the piezoelectric thin film;
   a first support layer surrounding a region including the interdigital transducer electrode;
   a second support layer disposed in the region surrounded by the first support layer; and
   a cover fixed on the first and second support layers so as to close a cavity defined by the first support layer; wherein
   the multilayer film is partially disposed on the support substrate;
   an insulating layer is disposed in at least a portion of a region in which the multilayer film is not disposed; and
   at least one of the first support layer and the second support layer is disposed on the insulating layer.

2. The elastic wave device according to claim 1, wherein the insulating layer extends from a location on the piezoelectric thin film through a side surface of the piezoelectric thin film and a side surface of the multilayer film to at least a portion of the region in which the multilayer film is not disposed.

3. The elastic wave device according to claim 1, further comprising:
   a first wiring electrode electrically connected to the interdigital transducer electrode and extending from a location on the piezoelectric thin film to a location on the insulating layer; wherein
   at least a portion of the first support layer is disposed on the first wiring electrode.

4. The elastic wave device according to claim 3, wherein in a portion in which the insulating layer is located on the piezoelectric thin film, a surface opposite to the piezoelectric thin film of the insulating layer includes an inclined surface inclined so as to approach the cover with increasing proximity to the first support layer from the interdigital transducer electrode.

5. The elastic wave device according to claim 4, wherein the first wiring electrode includes a portion that is located on the inclined surface of the insulating layer, and the portion is inclined along the inclined surface of the insulating layer.

6. The elastic wave device according to claim 1, wherein the first support layer and the insulating layer are made of the same material.

7. The elastic wave device according to claim 1, further comprising:
   a second wiring electrode electrically connected to the interdigital transducer electrode and extending from a location on the piezoelectric thin film to a location on the insulating layer; wherein
   at least a portion of the second support layer is disposed on the second wiring electrode.

8. The elastic wave device according to claim 1, wherein
   a height direction is a direction in which the support substrate and the cover face each other; and
   a level of a location in the height direction of the surface of the first support layer, which faces the cover, and a level of a location in the height direction of the surface of the second support layer, which faces the cover, is the same or substantially the same.

9. The elastic wave device according to claim 8, wherein
   the first support layer is disposed on the insulating layer; and
   a thickness of the insulating layer is set such that the level of the location in the height direction of the surface of the first support layer, which faces the cover, and the level of the location in the height direction of the surface of the second support layer, which faces the cover, are the same or substantially the same.

10. The elastic wave device according to claim 8, wherein
   the second support layer is disposed on the insulating layer; and
   a thickness of the insulating layer is set such that the level of the location in the height direction of the surface of the first support layer, which faces the cover, and the level of the location in the height direction of the surface of the second support layer, which faces the cover, is the same or substantially the same.

11. The elastic wave device according to claim 1, wherein the multilayer film includes a high acoustic velocity film through which a bulk wave propagates at an acoustic velocity higher than the acoustic velocity of an elastic wave that propagates through the piezoelectric thin film, as the at least one layer other than the piezoelectric thin film, and the piezoelectric thin film is stacked on the high acoustic velocity film.

12. The elastic wave device according to claim 1, wherein the multilayer film includes a high acoustic velocity film through which a bulk wave propagates at an acoustic velocity higher than the acoustic velocity of an elastic wave that propagates through the piezoelectric thin film, and a low acoustic velocity film, which is stacked on the high acoustic velocity film and through which a bulk wave propagates at an acoustic velocity lower than the acoustic velocity of an elastic wave that propagates through the piezoelectric thin film, as layers of the at least one layer other than the piezoelectric thin film, and the piezoelectric thin film is stacked on the low acoustic velocity film.

13. The elastic wave device according to claim 1, wherein
   the support substrate is a high acoustic velocity substrate through which a bulk wave propagates at an acoustic velocity higher than the acoustic velocity of an elastic wave that propagates through the piezoelectric thin film; and
   the multilayer film includes a low acoustic velocity film through which a bulk wave propagates at an acoustic velocity lower than the acoustic velocity of an elastic wave that propagates through the piezoelectric thin film, as the at least one layer other than the piezoelectric thin film, and the piezoelectric thin film is stacked on the low acoustic velocity film.

14. The elastic wave device according to claim 1, wherein the multilayer film includes a high acoustic impedance film having relatively high acoustic impedance and a low acoustic impedance film having acoustic impedance lower than the acoustic impedance of the high acoustic impedance film as layers of the at least one layer other than the piezoelectric thin film.

* * * * *